United States Patent [19]
Oka et al.

[11] Patent Number: 5,439,582
[45] Date of Patent: Aug. 8, 1995

[54] PROCESS FOR PRODUCING MULTICOLOR DISPLAY

[75] Inventors: Takeshi Oka, Suita; Takahito Kishida, Yao; Atsushi Kawakami, Suita; Masashi Ohata, Osaka; Akira Matsumura, Hirakata, all of Japan

[73] Assignee: Nippon Paint Co., Ltd., Osaka, Japan

[21] Appl. No.: 70,352

[22] PCT Filed: Oct. 2, 1991

[86] PCT NO.: PCT/JP92/01273
§ 371 Date: Jun. 1, 1993
§ 102(e) Date: Jun. 1, 1993

[87] PCT Pub. No.: WO/93/07518
PCT Pub. Date: Apr. 15, 1993

[30] Foreign Application Priority Data

Oct. 2, 1991 [JP] Japan ................... 3-255121

[51] Int. Cl.$^6$ ............................... C25D 5/02
[52] U.S. Cl. ...................... 205/135; 430/7; 430/321
[58] Field of Search ............... 205/122, 135; 204/181.1; 430/20, 7, 321

[56] References Cited

U.S. PATENT DOCUMENTS 4,491,628  1/1985  Ito et al. .................. 430/176

FOREIGN PATENT DOCUMENTS 272720  12/1986  Japan.

OTHER PUBLICATIONS

Matsumura et al., Proceedings of Eurodisplay '90 (10. Int. Display Research Conference) 25 Sep. 1990, Amsterdam, "The New Process For Preparing Multicolor Filter For LCDs", pp. 240–243.

Allen, Photopolymerisation and 1-4 Photoimaging Science and Technology, (no month) 1989, Elsevier Science Publication, London, New York, Chapter 3, p. 99: "The Chemistry of Photoresists" by Turner et al.

Frechet et al., J. Imaging Sci., "New Approach to Imaging Systems Incorporating Chemical Amplification: Synthesis and Preliminary Evaluation of Novel Resists Based on Tertiary Copolycarbonates", 30, 59–64 (1986) (March–April).

Crivello, Polymer Eng. Sci., "Using Onium Salts", 23, 953 (1983) December.

Primary Examiner—John Niebling
Assistant Examiner—Edna Wong
Attorney, Agent, or Firm—Wenderoth, Lind & Ponack

[57] ABSTRACT

The present invention provides an improved process for producing a multicolor display by which a color filter having neither coloring failure nor size failure is obtained.

The present invention provides a process comprising:
(I) a photosensitive resin layer formed on an electric conductive layer is exposed to light through a mask having a desired pattern which is placed on the photosensitive resin layer, and developed to bare partially the surface of the electric conductive layer;
(II) a colored layer is formed on the bared surface of the electric conductive layer by an electrodepositing process; and
(III) the above steps (I) and (II) are repeated desired times and then the remaining photosensitive resin layer is eluted with a removing solution which preferentially or selectively dissolves the photosensitive layer, to bare the remaining surface of the electric conductive layer.

5 Claims, 5 Drawing Sheets

PROCESS FOR PRODUCING MULTICOLOR DISPLAY

FIELD OF THE INVENTION

The present invention relates to a process for producing a multicolor display which is used for multicoloring display elements, such as a liquid crystal element and the like.

BACKGROUND OF THE INVENTION

A variety of processes for forming a color filter have been reported. Among them, the process employing electrodeposition is noticeable in the art. For example, Japanese Patent Application Ser. No. 3-12018 and Japanese Patent Kokai Publication No. 61-272720, the former filed by the present assignee, disclose the process comprising: forming an electroconductive layer on a substrate; forming a positive type photosensitive film thereon; pattern-wise exposing the film; removing the exposed part; and forming a desired colored layer by electrodeposition. Since a positive type photosensitive film is employed in this process, it is ideal that only the exposed part of the film is solubilized to a developer, whereby, the remaining photosensitive film still keeps photosensitivity and can repeat exposure and development.

However, in activity, the positive type photosensitive film adjacent to the edge of the formed colored layer is likely to be modified during the first developing, electrodepositing and heat curing and lose photosensitivity. The modified portion, in the subsequent colored layer forming process, often causes coloring failure, such as frame-like discoloration, or size failure, such as irregular pattern edge lines (see FIG. 9).

The present invention provides an improved process for producing a multicolor display by which a color filter having neither the coloring failure nor the size failure is obtained.

DISCLOSURE OF THE INVENTION

That is, the present invention provides a process for producing a multicolor display comprising the following steps:

(I) a photosensitive resin layer formed on an electric conductive layer is exposed to light through a mask having a desired pattern which is placed on the photosensitive resin layer, and developed to bare partially the surface of the electric conductive layer;

(II) a colored layer is formed on the bared surface of the electric conductive layer by an electrodepositing process; and (III) the above steps (I) and (II) are repeated desired times and then the remaining photosensitive resin layer is eluted with a removing solution which preferentially or selectively dissolves the photosensitive layer, to bare the remaining surface of the electric conductive layer.

The process above mentioned according to the present invention may further comprise any one of the following steps after said step (III):

(IV) a colored layer is formed on the bared remaining surface of the electric conductive layer by an electrodepositing process;

(V) a colored layer is formed on the bared remaining surface of the electric conductive layer by a coating process;

(VI) a colored layer is formed on the bared remaining surface of the electric conductive layer by a metallic plating process; or (VII) the bared remaining surface of the electric conductive layer is colored by an oxidation or reduction process.

A substrate as shown in FIG. 1(a) or 1(b) has to be provided first. Any substrate can be employed as long as its surface has electric conductivity. For example, a composite of insulation base 1 such as glass or plastics with thin electric conductive layer 2 such as chromium, nickel or indium oxide formed thereon, as well as an intrinsic electric conductive substrate 1' such as iron, stainless steel or copper are employed. The composite substrate as shown in FIG. 1(a) is employed for the following description.

A positive photosensitive resin layer 3 is formed on the electric conductive layer 2 as shown in FIG. 1(c). The positive type photosensitive resin layer once formed can be pattern-wise exposed and developed repeatedly without additional application thereof. The positive type photosensitive resin layer can be formed from a resin composition which comprises a polymer having branched groups unstable to carboxylic acid and a photopolymerization initiator which produces acid upon exposure to light (see, for example, Japanese Patent Application Ser. No. 3-12018 filed by the present assignee).

The polymer having branched groups unstable to carboxylic acid is a homopolymer or a copolymer of monomers having branched groups unstable to carboxylic acid. Examples of the monomers having branched groups unstable to carboxylic acid include p-butoxycarbonyloxy-α-methylstyrene, p-t-butoxycarbonyloxystyrene, t-butyl-p-vinyl benzoate, t-butyl-p-isopropenylphenyloxy acetate, t-butyl-methacrylate and the like. Examples of the comonomers copolymerizable with the monomers include monoolefinic and diolefinic hydrocarbons. The photopolymerization initiator has been known to the art, and include, for example, onium salts.

A mask 4 having a desired pattern is then placed on the positive type photosensitive layer 3 (FIG. 1(d)), the photosensitive resin layer is pattern-wise solubilized by exposing to light through the mask, and the solubilized part of the photosensitive resin layer is eluted to obtain the patterned substrate (FIG. 1(e)). Masking and eluting process employed are known to the art. As shown in FIG. 1(e), the resulting patterned substrate has two bared sites of the electric conductive layer 2. The patterned substrate is then dipped into an electrodeposition bath, and electric current is applied to the electric conductive layer 2 to form the colored layer, for example, red layer (R) 5 as shown in FIG. 1(f).

Any synthetic polymer resin selected from cationic, anionic and ampholytic resin, including those known to the art such as acrylic, epoxy, urethane, polybutadiene, polyamide, carboxyl group introduced polybutadiene and carboxyl group introduced alkyd resin is employed for a film forming component of the electrodeposition bath. In selecting the synthetic polymer resin, however, care should be taken not to employ an ionic polymer which deteriorates the electric conductive layer 2. Japanese Patent Kokai Publication No. 59-114592 and 63-210901 filed by the present assignee disclose the electrodeposition bath or others in more detail. Either photocurable or thermocurable electrodepositable paint may be employed in the present invention.

Another mask 4' is then placed on the surface of the colored layer and the positive type photosensitive layer 3 as shown in FIG. 1(g), the photosensitive resin layer is pattern-wise solubilized and eluted as described above, and another patterned substrate (FIG. 1(h)) is provided. If the mask 4' is the same as mask 4, a position of the mask on the photosensitive resin layer will have to be shifted.

The patterned substrate is dipped into the electrodeposition bath, and electric current is applied to the electric conductive layer 2 to form the colored layer, for example, green layer (G) 6 as shown in FIG. 2(i).

Further by again conducting the steps shown in FIG. 1(g)–(h) and FIG. 2(i), another colored layer, for example, blue (B) 7 is formed (FIG. 2 (j)–(l)). Similarly to that noted above, if the mask 4" is the same as mask 4 or 4', a position of the mask on the photosensitive resin layer will have to be shifted.

Coloring (e.g., black coloring) the electric conductive layer surface outside the colored layer is one embodiment of the present invention. In such case, the remaining photosensitive layer on the electric conductive layer surface (FIG. 2(l)) is selectively eluted with removing solution to obtain the substrate having bared electric conductive layer (FIG. 3(m)). The removing solution employed differs from developing solution used for patterning in its components or composition ratio.

The colored layer, for example, black layer (Bl) 8 shown in FIG. 3(n) is formed by dipping the patterned substrate into the electrodeposition bath, and applying electric current to the electric conductive layer 2.

Forming patterned colored layer on the surface of the electric conductive layer on addition to the colored layer noted above (R, G, B) is another embodiment of the present invention. In Such case, the colored layer, for example, black layer (Bl) 9 is formed according to the steps described for forming colored layer (R, G, B) as shown in FIG. 4(o)–(q).

The remaining photosensitive layer over the electric conductive layer surface (FIG. 4(q)) is then selectively eluted out with the removing solution to obtain substrate having bared electric conductive layer (FIG. 4(r)). The removing solution employed differs from developing solution used for patterning in its component or composition ratio.

The colored layer, for example, clear layer (C) 10 shown in FIG. 4(s) is formed by dipping the patterned substrate into an electrodeposition bath, and applying electric current to the electric conductive layer 2.

After the colored layer is formed, it is possible to use the electric conductive layer 2 as electrode other than for electrodepositing (e.g., for driving) by connecting the electric conductive layer 2 to exterior electric power source. In such case, the substrate having bared electric conductive layer 2 (FIG. 4(t)) may also be obtained by, for example, forming colored layer shown in FIG. 4(s) (Bl, C etc.) according to similar steps which were described to form the colored layer (R, G, B), and then eluting selectively the photosensitive resin layer. In the case that colored layer (Bl, C etc.) is unnecessary, the photosensitive layer may be removed using the removing solution above described (FIG. 4(u)).

Plating process employed in the present invention includes electro plating, electroless plating and combination thereof.

According to the present process for producing multicolor display, the color filter having random arranged colored layer without coloring failure and size failure is produced independent of the shape of the electric conductive layer.

EXAMPLES

The following examples further illustrate the present invention, but they should not be construed to limit the scope thereof.

Reference Example 1

Preparation of Positive Photosensitive Resin. Composition

Into 50 g of xylene containing 2.0 g of azobisisobutyronitrile were added t-butyl methacrylate 65.0 g, butyl acrylate 20.0 g and methyl methacrylate 20.0 g, and stirred for 10 hour at 60° C. under a nitrogen blanket. The cooled reactant was diluted with tetrahydrofuran, and washed with petroleum ether/methanol. Polymer obtained weighed 93.0 g (93% yield), and had a number average molecular weight of 22000 (GPC). The polymer was dissolved into tetrahydrofuran at an amount providing 20% by weight solution, and 20% by weight based on the polymer of triphenylsulfonium hexafluoroantimonate was added to the solution to obtain positive type photosensitive resin composition.

Reference Example 2

Preparation of Positive Photosensitive Resin Composition Developing Solution

The following positive type photosensitive resin composition developing solution was prepared.

| Sodium hydroxide | 5 parts by weight |
| Pure water | 995 parts by weight |

Reference Example 3

Preparation of Anionic Electrolyte Bath Solution for Color Filter Production

The following anionic electrodepositable resin composition was prepared.

| Anionic polyester resin | 95.0 parts by weight |
| Melamine resin | 18.0 parts by weight |
| Butyl cellosolve | 25.0 parts by weight |
| Ethyl cellosolve | 5.0 parts by weight |
| n-Butanol | 18.0 parts by weight |
| Triethylamine | 2.5 parts by weight |
| Ion exchange water | 836.5 parts by weight |

The tabulated amount of pigment was combined to the resulting electrodepositable resin composition to obtain four colored anionic electrodepositable solutions.

| | Blue | Green | Red | Black |
|---|---|---|---|---|
| Resin composition | 995.0 | 995.0 | 995.0 | 992.5 |
| Phthalocyanine blue | 5.0 | — | — | — |
| Phthalocyanine green | — | 5.0 | — | — |
| Red pigment[1] | — | — | 5.0 | — |
| Carbon black | — | — | — | 7.5 |

[1] Azometal salt red pigment

Reference Example 4

Preparation of Positive Photosensitive Resin Composition Removing Solution

The following positive type photosensitive resin composition removing solution 1 was prepared.

| | |
|---|---|
| Ethanolamine | 85 parts by weight |
| Butyl cellosolve | 115 parts by weight |
| Furfuryl alcohol | 300 parts by weight |
| Dipropylene glycol methyl ether | 500 parts by weight |

The following positive type photosensitive resin composition removing solution 2 was prepared by diluting the removing solution 1 with pure water.

| | |
|---|---|
| Ethanolamine | 68 parts by weight |
| Butyl cellosolve | 92 parts by weight |
| Furfuryl alcohol | 240 parts by weight |
| Dipropylene glycol methyl ether | 400 parts by weight |
| Pure water | 200 parts by weight |

The following positive type photosensitive resin composition removing solution 3 was prepared.

| | |
|---|---|
| Isopropyl alcohol | 90 parts by weight |
| Diethanolamine | 10 parts by weight |

Reference Example 5

Preparation of Chromium Plating Bath

The following chromium plating bath was prepared.

| | |
|---|---|
| Chromic acid anhydride | 400.0 g/l |
| Sodium hydroxide | 60.0 g/l |
| Barium carbonate | 7.5 g/l |
| Silicofluoric acid | 1.0 ml/l |

Reference Example 6

Preparation of Reducing Electrolyte

Aqueous hydrochloric acid solution having a concentration of 4% was prepared.

EXAMPLE 1

Onto a glass substrate 1 having clear electric conductive film layer 2 (ITO (indium tin oxide)) thereon (FIG. 1(a)), the positive type photosensitive resin composition of the reference example 1 was applied using a spinner, and the applied positive type photosensitive resin composition was then dried to form a positive type photosensitive resin layer 3 (FIG. 1(c)).

The layer was then exposed to a high pressure mercury lamp through mask 4 having predetermined pattern (FIG. 1(d)), heated at 100° C. for 3 minutes, and the exposed part of the layer was eluted with above mentioned positive type photosensitive resin composition developing solution to bare the surface of the clear electric conductive film layer 2. The substrate 1 having the bared surface (FIG. 1(e)) was then dipped into an electrodeposition bath including red anionic electrodepositable solution, and a direct current voltage of 30 V was applied to the clear electric conductive film layer 2 as a positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. On the other hand, the water insoluble polymer deposited onto the voltage applied surface of the clear electric conductive film layer was not removed by rinsing with water. Subsequent drying provided good, transparent red polymer film 5 deposited onto the clear electric conductive layer (FIG. 1(f)). The colored polymer film 5 had a thickness of 2 μm.

The positive type photosensitive resin layer was again exposed to the high pressure mercury lamp through another mask 4' having shifted pattern (FIG. 1(g)), heated at 100° C. for 3 minutes, and developed with the positive type photosensitive resin composition developing solution to bare the surface of the clear electric conductive film layer 2. The substrate 1 having bared surface (FIG. 1(h)) was then dipped into an electrodeposition bath including green anionic electrodepositable solution, and a direct current voltage of 35 V was applied to the clear electric conductive film layer 2 as positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. Subsequent drying provides good transparent green polymer film 6 deposited on the clear electric conductive layer (FIG. 2(i)). The colored polymer film 6 had a thickness of 2 μm.

The positive type photosensitive resin layer was again exposed through another mask 4" having shifted pattern (FIG. 2(j)), heated and developed as described above (FIG. 2(k)), and blue electrodeposition was conducted at a direct current voltage of 30 V for 5 seconds. Subsequent rinsing and drying provide blue polymer film 7 as shown above (FIG. 2(l)). The colored polymer film 7 had a thickness of 2 μm.

The substrate 1 having positive type photosensitive resin layer, and red, green and blue colored layer thereon was then dipped into the positive type photosensitive resin composition removing solution of the reference example 4 for 3 minutes with stirring. Selective elution of the positive type photosensitive resin layer was provided by rinsing the substrate with water. Subsequent drying provides the substrate 1 having bared surface and colored layer thereon (FIG. 3(m)).

The color filter thus obtained had no coloring failure and size failure, and had improved property (see FIG. 8).

Other color filter preparation in essentially the same manner as described above except that the positive type photosensitive resin composition removing solution 2 or 3 instead of the positive type photosensitive resin composition removing solution 1 provided comparable results.

EXAMPLE 2

Onto a glass substrate 1 having clear electric conductive film layer 2 (ITO (indium tin oxide)) thereon (FIG. 1(a)), the positive type photosensitive resin composition of the reference example 1 was applied using a spinner, and the applied positive type photosensitive resin composition was then dried to form a positive type photosensitive resin layer 3 (FIG. 1(c)).

The layer was then exposed to a high pressure mercury lamp through mask 4 having predetermined pattern (FIG. 1(d)), heated at 100° C. for 3 minutes, and the exposed part of the layer was eluted with above mentioned positive type photosensitive resin composition developing solution to bare the surface of the clear electric conductive film layer 2. The substrate 1 having the bared surface (FIG. 1(e)) was then dipped into an electrodeposition bath including red anionic electrodepositable solution, and a direct current voltage of 30 V was applied to the clear electric conductive film layer 2 as a positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. On the other hand, the water insoluble polymer deposited onto the voltage applied surface of the clear electric conductive film layer was not removed by rinsing with water. Subsequent drying provided good transparent red polymer film 5 deposited onto the clear electric conductive layer (FIG. 1(f)). The colored polymer film 5 had a thickness of 2 μm.

The positive type photosensitive resin layer was again exposed to the high pressure mercury lamp through another mask 4' having shifted pattern (FIG. 1(g)), heated at 100° C. for 3 minutes, and developed with the positive type photosensitive resin composition developing solution to bare the surface of the clear electric conductive film layer 2. The substrate 1 having bared surface (FIG. 1(h)) was then dipped into an electrodeposition bath including green anionic electrodepositable solution, and a direct current voltage of 35 V was applied to the clear electric conductive film layer 2 as positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. Subsequent drying provides good transparent green polymer film 6 deposited on the clear electric conductive layer (FIG. 2(i)). The colored polymer film 6 had a thickness of 2 μm.

The positive type photosensitive resin layer was again exposed through another mask 4 having shifted pattern (FIG. 2(j)), heated and developed as described above (FIG. 2(k)), and blue electrodeposition was conducted at a direct current voltage of 30 V for 5 seconds. Subsequent rinsing and drying provide blue polymer film 7 as shown above (FIG. 2(l)). The colored polymer film 7 had a thickness of 2 μm.

The substrate 1 having positive type photosensitive resin layer, and red, green and blue colored layer thereon was then dipped into the positive type photosensitive resin composition removing solution of the reference example 4 for 3 minutes with stirring. Selective elution of the positive type photosensitive resin layer was provided by rinsing the substrate with water. Subsequent drying provides the substrate 1 having bared surface and colored layer thereon (FIG. 3(m)).

Finally, black electrodeposition was conducted at a direct current voltage of 3 V for 20 seconds. Subsequent rinsing and drying provided black colored layer on the bared part of the clear electric conductive film (FIG. 2(n)). The colored polymer film had a thickness of 2 μm.

The color filter thus obtained had no coloring failure and size failure, and had improved property.

EXAMPLE 3

Onto a glass substrate 1 having clear electric conductive film layer 2 (ITO (indium tin oxide)) thereon (FIG. 1(a)), the positive type photosensitive resin composition of the reference example 1 was applied using a spinner, and the applied positive type photosensitive resin composition was then dried to form a positive type photosensitive resin layer 3 (FIG. 1(c)).

The layer was then exposed to a high pressure mercury lamp through mask 4 having predetermined pattern (FIG. 1(d)), heated at 100° C. for 3 minutes, and the exposed part of the layer was eluted with above mentioned positive type photosensitive resin composition developing solution to bare the surface of the clear electric conductive film layer 2. The substrate 1 having the bared surface (FIG. 1(e)) was then dipped into an electrodeposition bath including red anionic electrodepositable solution, and a direct current voltage of 30 V was applied to the clear electric conductive film layer 2 as a positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. On the other hand, the water insoluble polymer deposited onto the voltage applied surface of the clear electric conductive film layer was not removed by rinsing with water. Subsequent drying provided good transparent red polymer film 5 deposited onto the clear electric conductive layer (FIG. 1(f)). The colored polymer film 5 had a thickness of 2 μm.

The positive type photosensitive resin layer was again exposed to the high pressure mercury lamp through another mask 4' having shifted pattern (FIG. 1(g)), heated at 100° C. for 3 minutes, and developed with the positive type photosensitive resin composition developing solution to bare the surface of the clear electric conductive film layer 2. The substrate 1 having bared surface (FIG. 1(h)) was then dipped into an electrodeposition bath including green anionic electrodepositable solution, and a direct current voltage of 35 V was applied to the clear electric conductive film layer 2 as positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. Subsequent drying provides good transparent green polymer film 6 deposited on the clear electric conductive layer (FIG. 2(i)). The colored polymer film 6 had a thickness of 2 μm.

The positive type photosensitive resin layer was again exposed through another mask 4 having shifted pattern (FIG. 2(j)), heated and developed as described above (FIG. 2(k)), and blue electrodeposition was conducted at a direct current voltage of 30 V for 5 seconds. Subsequent rinsing and drying provide blue polymer film 7 as shown above (FIG. 2(l)). The colored polymer film 7 had a thickness of 2 μm.

The substrate 1 having positive type photosensitive resin layer, and red, green and blue colored layer thereon was then dipped into the positive type photosensitive resin composition removing solution of the reference example 4 for 3 minutes with stirring. Selective elution of the positive type photosensitive resin layer was provided by rinsing the substrate with water. Subsequent drying provides the substrate 1 having bared surface and colored layer thereon (FIG. 3(m)).

Finally, commercially available black resist composition was applied onto the whole surface having colored layer thereon of the bared substrate by spin coat process, and dried (FIG. 5(v)). The surface not having colored layer of the substrate was then exposed to the high pressure mercury lamp, and the black resist was developed with a commercially available black resist developing solution to obtain black layer 11 which fills the spaces between red, green and blue color layer (FIG. 5(w)). The black layer film had a thickness of 2 μm.

The color filter thus obtained had no coloring failure and size failure, and had improved property.

EXAMPLE 4

Onto a glass substrate 1 having clear electric conductive film layer 2 (ITO (indium tin oxide)) thereon (FIG. 1(a)), the positive type photosensitive resin composition of the reference example 1 was applied using a spinner, and the applied positive type photosensitive resin composition was then dried to form a positive type photosensitive resin layer 3 (FIG. 1(c)).

The layer was then exposed to a high pressure mercury lamp through mask 4 having predetermined pattern (FIG. 1(d)), heated at 100° C. for 3 minutes, and the exposed part of the layer was eluted with above mentioned positive type photosensitive resin composition developing solution to bare the surface of the clear electric conductive film layer 2. The substrate 1 having the bared surface (FIG. 1(e)) was then dipped into an electrodeposition bath including red anionic electrodepositable solution, and a direct current voltage of 30 V was applied to the clear electric conductive film layer 2 as a positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. On the other hand, the water insoluble polymer deposited onto the voltage applied surface of the clear electric conductive film layer was not removed by rinsing with water. Subsequent drying provided good transparent red polymer film 5 deposited onto the clear electric conductive layer (FIG. 1(f)). The colored polymer film 5 had a thickness of 2 μm.

The positive type photosensitive resin layer was again exposed to the high pressure mercury lamp through another mask 4' having shifted pattern (FIG. 1(g)), heated at 100° C. for 3 minutes, and developed with the positive type photosensitive resin composition developing solution to bare the surface of the clear electric conductive film layer 2. The substrate 1 having bared surface (FIG. 1(h)) was then dipped into an electrodeposition bath including green anionic electrodepositable solution, and a direct current voltage of 35 V was applied to the clear electric conductive film layer 2 as positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. Subsequent drying provides good transparent green polymer film 6 deposited on the clear electric conductive layer (FIG. 2(i)). The colored polymer film 6 had a thickness of 2 μm.

The positive type photosensitive resin layer was again exposed through another mask 4 having shifted pattern (FIG. 2(j)), heated and developed as described above (FIG. 2(k)), and blue electrodeposition was conducted at a direct current voltage of 30 V for 5 seconds. Subsequent rinsing and drying provide blue polymer film 7 as shown above (FIG. 2(l)). The colored polymer film 7 had a thickness of 2 μm.

The substrate 1 having positive type photosensitive resin layer, and red, green and blue colored layer thereon was then dipped into the positive type photosensitive resin composition removing solution of the reference example 4 for 3 minutes with stirring. Selective elution of the positive type photosensitive resin layer was provided by rinsing the substrate with water. Subsequent drying provides the substrate 1 having bared surface and colored layer thereon (FIG. 3(m)).

Finally, the substrate 1 having the bared surface 2 was cathodized and dipped into the chromium plating bath of the reference example 5, and a direct current voltage of 5 V was applied to an lead-tin alloy anode for 5 seconds to obtain a chrome plating layer 12 was formed onto the clear electric conductive layer 2 (FIG. 6(x)).

The color filter thus obtained had no coloring failure and size failure, and had improved property.

EXAMPLE 5

Onto a glass substrate 1 having clear electric conductive film layer 2 (ITO (indium tin oxide)) thereon (FIG. 1(a)), the positive type photosensitive resin composition of the reference example 1 was applied using a spinner, and the applied positive type photosensitive resin composition was then dried to form a positive type photosensitive resin layer 3 (FIG. 1(c)).

The layer was then exposed to a high pressure mercury lamp through mask 4 having predetermined pattern (FIG. 1(d)), heated at 100° C. for 3 minutes, and the exposed part of the layer was eluted with above mentioned positive type photosensitive resin composition developing solution to bare the surface of the clear electric conductive film layer 2. The substrate 1 having the bared surface (FIG. 1(e)) was then dipped into an electrodeposition bath including red anionic electrodepositable solution, and a direct current voltage of 30 V was applied to the clear electric conductive film layer 2 as a positive electrode for 5 seconds.

Thereafter, the substrate was taken out from the bath,. and rinsed with water sufficiently. Since the electrodepositable paint placed on the positive type photosensitive resin layer surface was not deposited, it was removed easily by rinsing with water. On the other hand, the water insoluble polymer deposited onto the voltage applied surface of the clear electric conductive film layer was not removed by rinsing with water. Subsequent drying provided good transparent red polymer film 5 deposited onto the clear electric-conductive layer (FIG. 1(f)). The colored polymer film 5 had a thickness of 2 μm.

The positive type photosensitive resin layer was again exposed to the high pressure mercury lamp through another mask 4' having shifted pattern (FIG. 1(g)), heated at 100° C. for 3 minutes, and developed with the positive type photosensitive resin composition developing solution to bare the surface of the clear electric conductive film layer 2. The substrate 1 having bared surface (FIG. 1(h)) was then dipped into an electrodeposition bath including green anionic electrodepositable solution, and a direct current voltage of 35 V was applied to the clear electric conductive film layer 2 as positive electrode for 5 seconds.

Thereafter, the substrate was taken out from the bath, and rinsed with water sufficiently. Since the electrodepositable paint placed on the positive type photosensitive resin layer surface was not deposited, it was removed easily by rinsing with water. Subsequent drying provides good transparent green polymer film 6 deposited on the clear electric conductive layer (FIG. 2(i)). The colored polymer film 6 had a thickness of 2 μm.

The positive type photosensitive resin layer was again exposed through another mask 4" having shifted pattern 2(j)), heated and developed as described above (FIG. 2(k)), and blue electrodeposition was conducted at a direct current voltage of 30 V for 5 seconds. Subsequent rinsing and drying provide blue polymer film 7 as shown above (FIG. 2(l)). The colored polymer film 7 had a thickness of 2 μm.

The substrate 1 having positive type photosensitive resin layer, and red, green and blue colored layer thereon was then dipped into the positive type photosensitive resin composition removing solution of the reference example 4 for 3 minutes with stirring. Selective elution of the positive type photosensitive resin layer was provided by rinsing the substrate with water. Subsequent drying provides the substrate 1 having bared surface and colored layer thereon (FIG. 3(m)).

Finally, the substrate 1 having the bared surface 2 was cathodized and dipped into the reducing electrolyte of the reference example 6, and a direct current voltage of 25 V was applied to an stainless steel plate anode for 5 seconds to form black layer 13 on the result of electrical field reduction of the bared clear electric conductive layer 2 (FIG. 7(y)).

The color filter thus obtained had no coloring failure and size failure, and had improved property.

EFFECT OF THE INVENTION

According to the present invention, a color filter having excellent display quality without coloring failure and size failure is produced even in the condition that the edge of the photosensitive coating loses photosensitivity, and the edge of the coating leaves itself on the electroconductive layer. Saving preparing steps is another effect of the present invention.

Figure 1A:
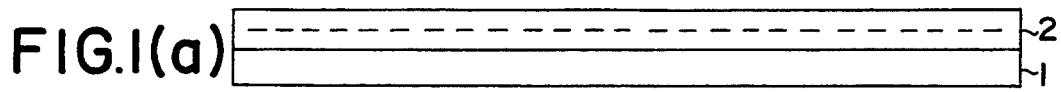
FIG. 1(a)–(h) are cross sectional views of a flow sheet illustrating one preparing process of the present invention.
Figure 1B:
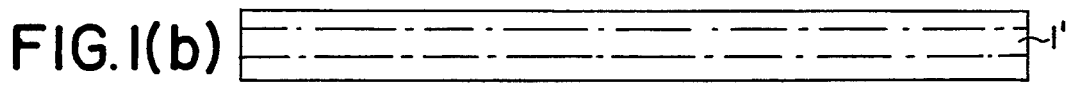
Figure 1C:
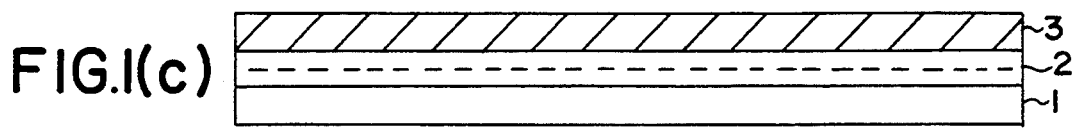
Figure 1D:
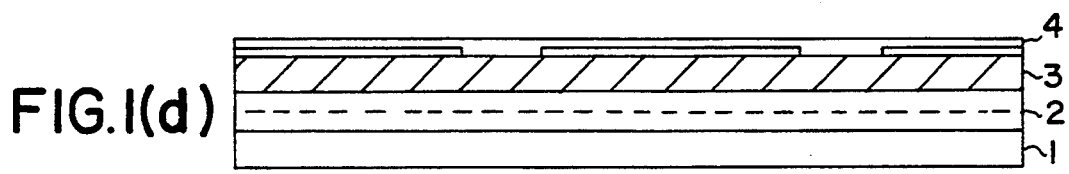
Figure 1E:
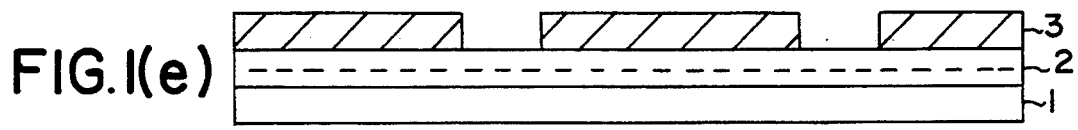
Figure 1F:
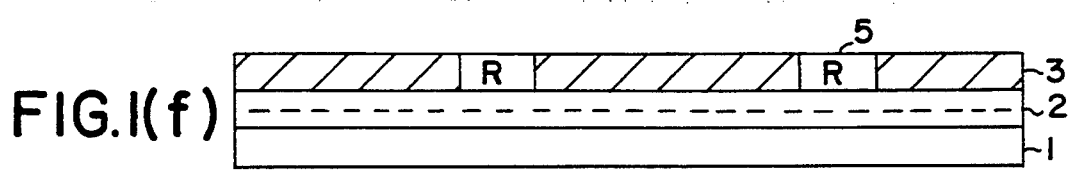
Figure 1G:
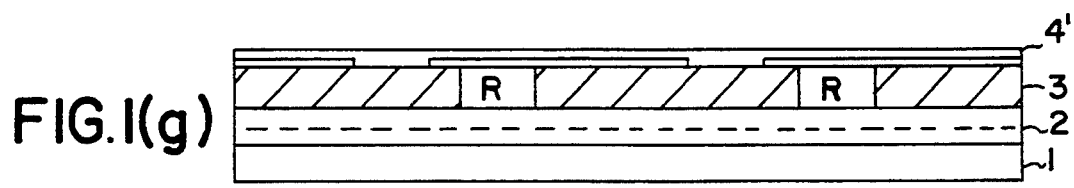
Figure 1H:
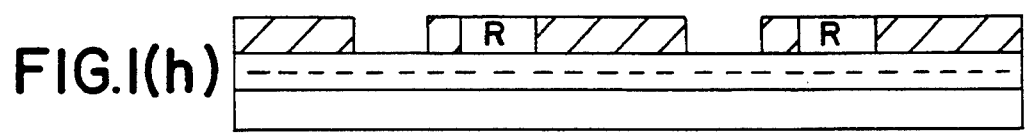
Figure 2I:
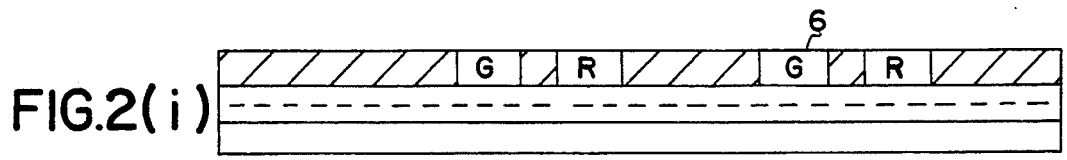
FIG. 2(i)–(l) are cross sectional views of a flow sheet illustrating another preparing process of the present invention.
Figure 2J:
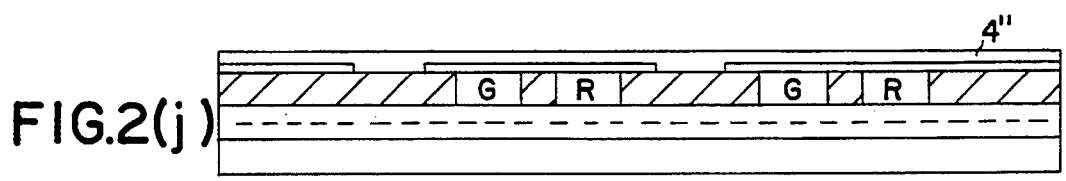
Figure 2K:
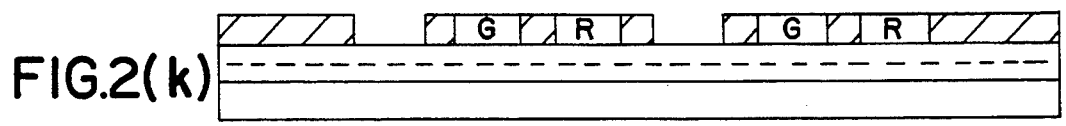
Figure 2L:
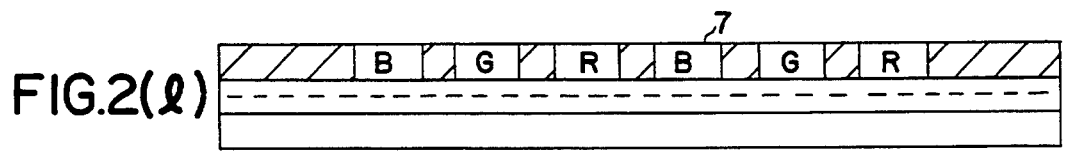
Figure 3M:
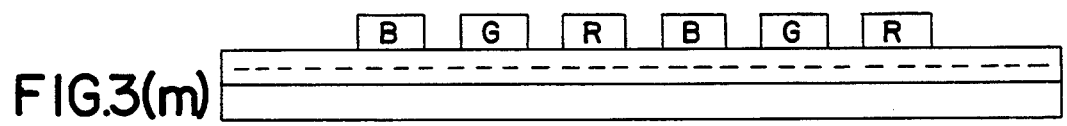
FIG. 3(m) and (n) are cross sectional views of a flow sheet illustrating another preparing process of the present invention.
Figure 3N:
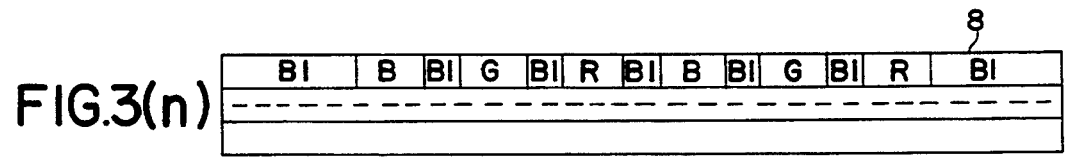
Figure 4O:
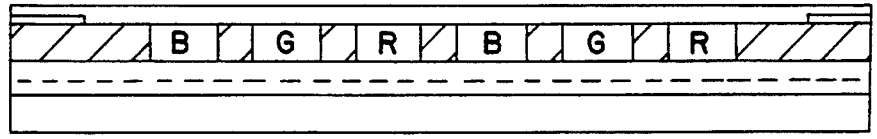
FIG. 4(o)–(u) are cross sectional views of a flow sheet illustrating another preparing process of the present invention.
Figure 4P:
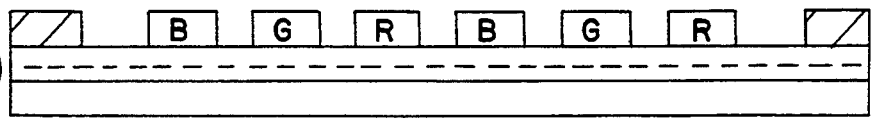
Figure 4Q:
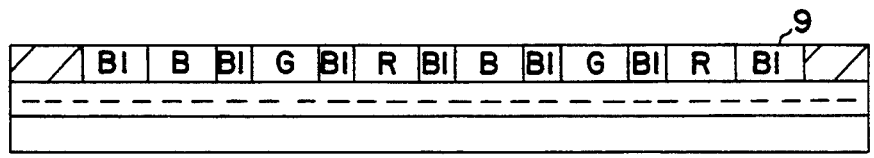
Figure 4R:
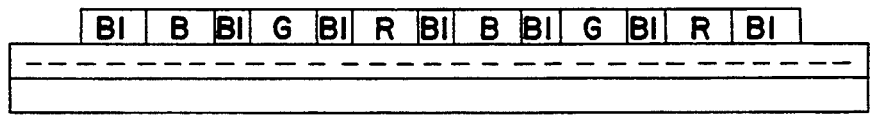
Figure 4S:
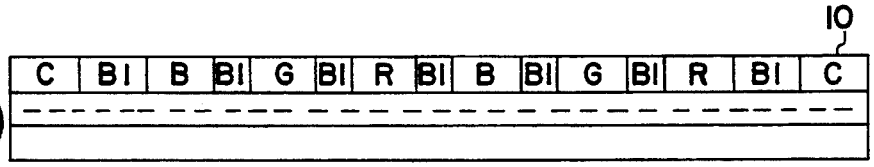
Figure 4T:
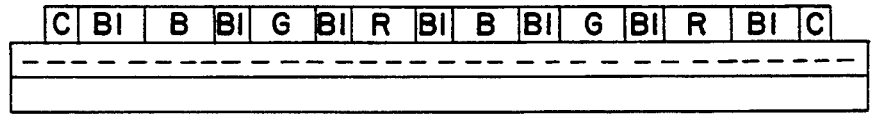
Figure 4U:
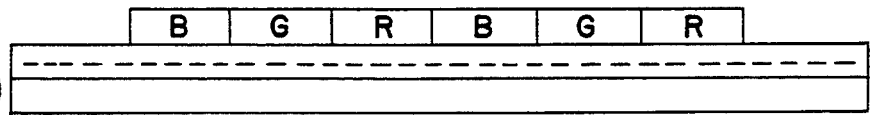
Figure 5V:
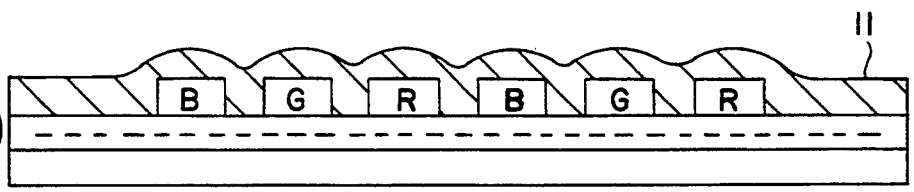
FIG. 5(v) and (w) are cross sectional views of a flow sheet illustrating another preparing process of the present invention.
Figure 5W:
Figure 6X:
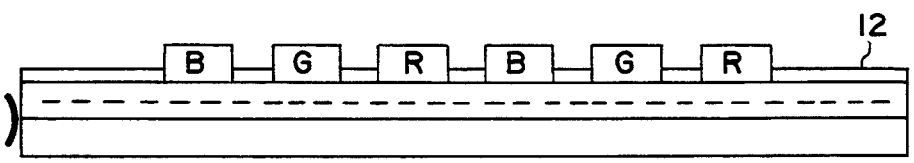
FIG. 6(x) is a cross sectional view of flow sheet illustrating another preparing process of the present invention.
Figure 7Y:
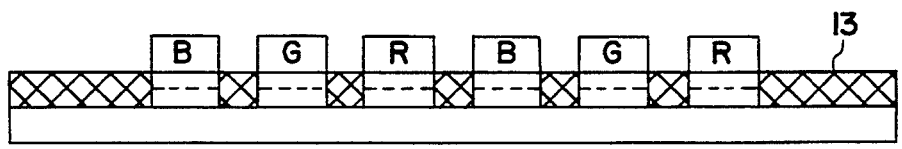
FIG. 7(y) is a cross sectional view of a flow sheet illustrating another preparing process of the present invention.
Figure 8:
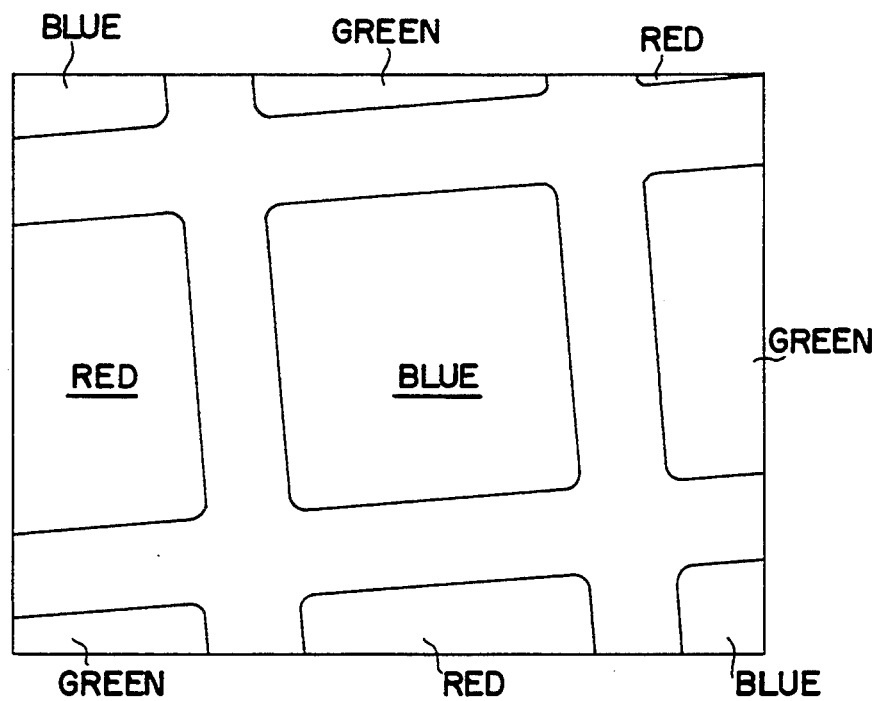
FIG. 8 is an enlarged view illustrating the surface of the color filter prepared according to the present invention, and the photograph showing the surface is filed attached thereto.
Figure 9:
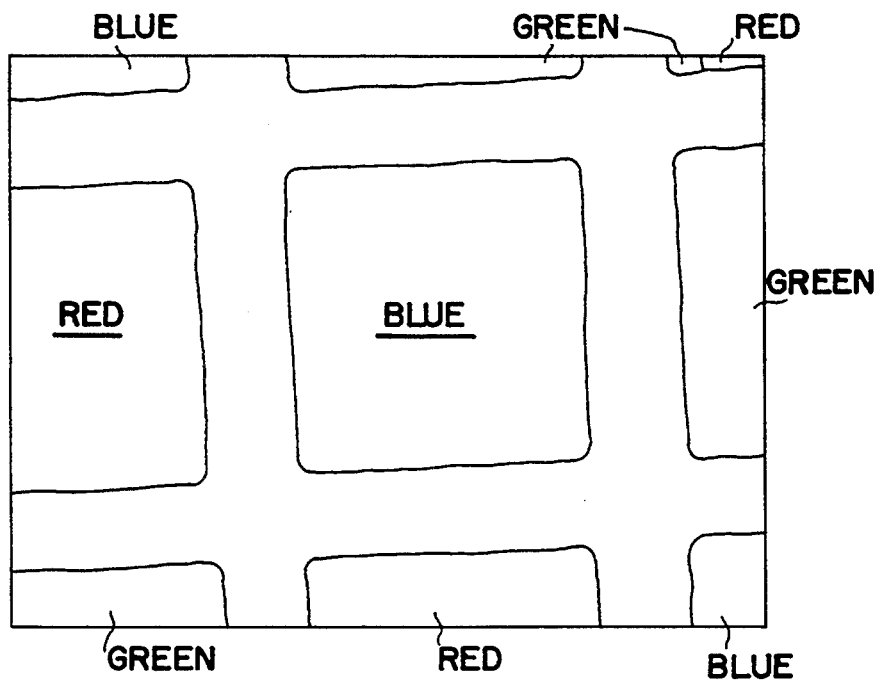
FIG. 9 is an enlarged view illustrating the surface of the color filter prepared according to the prior art process, and the photograph showing the surface is filed attached thereto.

We claim:

1. A process for producing a multicolor display consisting essentially of the following steps:
    (I) a photosensitive resin layer formed on an electric conductive layer is exposed to light through a mask having a desired pattern which is placed on the photosensitive resin layer, and developed to bare partially the surface of the electric conductive layer;
    (II) a colored layer is formed on the bared surface of the electric conductive layer by an electrodepositing process; and
    (III) the above steps (I) and (II) are repeated desired times and then the remaining photosensitive resin layer is eluted with a removing solution which preferentially or selectively dissolves the photosensitive layer, to bare the remaining surface of the electric conductive layer,
    wherein said photosensitive resin layer is formed from a resin composition comprising a polymer having branched groups unstable to carboxylic acid and a photopolymerization initiator which produces acid upon exposure to light.

2. The process according to claim 1, further consisting essentially of the following step after said step (III):
    (IV) a colored layer is formed on the bared remaining surface of the electric conductive layer by an electrodepositing process.

3. The process according to claim 1, further consisting essentially of the following step after said step (III):
    (V) a colored layer is formed on the bared remaining surface of the electric conductive layer by a coating process.

4. The process according to claim 1, further consisting essentially of the following step after said step (III):
    (VI) a colored layer is formed on the bared remaining surface of the electric conductive layer by plating a metal on the bared remaining surface.

5. The process according to claim 1, further consisting essentially of the following step after said step (III):
    (VII) the bared remaining surface of the electric conductive layer is colored by an oxidation or reduction process.

* * * * *

UNITED STATES PATENT AND TRADEMARK OFFICE
CERTIFICATE OF CORRECTION

PATENT NO. : 5,439,582
DATED : August 8, 1995
INVENTOR(S) : Takeshi OKA, Takahito KISHIDA, Atsushi KAWAKAMI, Masashi OHATA and Akira MATSUMURA It is certified that error appears in the above-indentified patent and that said Letters Patent is hereby corrected as shown below:

On the title page, item [22], should be

PCT filing date to --October 2, 1992--.

Signed and Sealed this

Fourteenth Day of November, 1995

Attest:

BRUCE LEHMAN

*Attesting Officer*  *Commissioner of Patents and Trademarks*